United States Patent
Berkeman

(10) Patent No.: US 7,873,800 B2
(45) Date of Patent: Jan. 18, 2011

(54) ADDRESS GENERATOR FOR AN INTERLEAVER MEMORY AND A DEINTERLEAVER MEMORY

(75) Inventor: Anders Berkeman, Lund (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 915 days.

(21) Appl. No.: 10/598,714

(22) PCT Filed: Mar. 3, 2005

(86) PCT No.: PCT/EP2005/002221
§ 371 (c)(1),
(2), (4) Date: Mar. 8, 2007

(87) PCT Pub. No.: WO2005/091509
PCT Pub. Date: Sep. 29, 2005

(65) Prior Publication Data
US 2007/0139428 A1      Jun. 21, 2007

Related U.S. Application Data

(60) Provisional application No. 60/553,438, filed on Mar. 16, 2004.

(30) Foreign Application Priority Data

Mar. 10, 2004    (EP) .................................. 04005627

(51) Int. Cl.
*G06F 12/00*    (2006.01)
(52) U.S. Cl. ...................... 711/157; 711/5; 711/E12.07

(58) Field of Classification Search .................... None
See application file for complete search history.

(56) References Cited

U.S. PATENT DOCUMENTS

| | | | | |
|---|---|---|---|---|
| 5,128,998 | A * | 7/1992 | Kurihara | 380/46 |
| 5,687,325 | A * | 11/1997 | Chang | 710/104 |
| 6,314,534 | B1 * | 11/2001 | Agrawal et al. | 714/702 |
| 6,625,234 | B1 | 9/2003 | Cui et al. | |
| 6,891,689 | B2 * | 5/2005 | Taguchi et al. | 360/51 |

FOREIGN PATENT DOCUMENTS

WO      WO 00/60751 A      10/2000

OTHER PUBLICATIONS

Sophia-Antipo, FR: "Digital Video Broadcasting (DVB); Framing structure, channel coding and modulation for digital terrestrial television; ETSI EN 300 744" ETSI Standards, European Telecommunications Standards Institute, vol. BC, No. V141, Jan. 2001, XP014001882 ISSN: 0000-0001 cited in the application p. 18-p. 19.

* cited by examiner

*Primary Examiner*—Reginald G Bragdon
*Assistant Examiner*—Hamdy S Ahmed

(57) ABSTRACT

Method and device for generating an address value for addressing an interleaver memory. Consecutive address fragments to which a most significant bit(s) is to be appended are generated. Only a fraction of the address fragments generated, which potentially will exceed a maximum allowable value, is compared to the maximum allowable value. If the compared address fragment exceeds the maximum allowable value it is discarded. If the compared address fragment does not exceed the maximum allowable value it is accepted.

50 Claims, 4 Drawing Sheets

ADDRESS GENERATOR FOR AN INTERLEAVER MEMORY AND A DEINTERLEAVER MEMORY

This application claims the benefit of U.S. Provisional Application No. 60/553,438, filed Mar. 16, 2004, the disclosure of which is fully incorporated herein by reference.

TECHNICAL FIELD OF THE INVENTION

The present invention relates to a method for generating address values for addressing a memory. More specifically, the address values are generated as they are needed for addressing the memory. The invention also relates to a device for generating address values for addressing a memory.

DESCRIPTION OF RELATED ART

Interleaving/deinterleaving is used to render a bursty communication channel into a communication channel having seemingly independent errors. By interleaving data to be transmitted, error bursts due to the bursty channel are split up after deinterleaving and thus distributed over a wider range of received symbols. When the transmitted data are received and deinterleaved, a code suitable for correcting independent errors can be used to restore the data.

In the interleaver/deinterleaver, a memory is used for storing blocks of data to be interleaved/deinterleaved. The memory may be large, and it is therefore preferred to calculate the address pattern for addressing the memory on-the-fly, i.e. as the addresses are needed. Alternatively, the addresses may be kept in a table, which requires additional storage capacity.

The address patterns may be calculated using LFSR (Linear Feedback Shift Register) techniques. Typically, the LFSR is adapted to generate maximum length or PN (Pseudo Noise) sequences.

An address value may be provided by generating an address fragment, to which one or several most significant bits (MSB) are appended. However, it is a problem with such address generation techniques that the generated address may be out of range of the allowable addresses when the MSB is appended. If the generated address value is out of range it has to be discarded, and a new address value has to be generated instead. To make sure that all generated addresses are within range, all generated address value have to be compared to a maximum allowable value. Thus, a large number of unnecessary comparisons are made, which requires unnecessary time and processing capacity.

In the DVB (Digital Video Broadcasting) standard ETSI EN300744, v1.4.1, ETSI, January 2001, symbol interleaving from index q to index H(q) is defined. Both q and H(q) are composed of $N_r$ bits. Calculation of H(q) includes generating an $N_r-1$ bit word $R_i$, which is a permuted version of $R'_i$, the state of an LFSR.

Running the algorithm for symbol interleaving for i=0, 1, . . . $M_{max}-1$, where $M_{max}$ is the length of the maximum length sequence output by the LFSR, will result in generation of all valid H(q) values, q=0, 1, . . . , $N_{max}-1$, where $N_{max}$ is the number of addresses of the wanted interleaving sequence. Since $M_{max} > N_{max}$ it has to be checked, for each generated H(q), that H(q) is valid, i.e. that H(q) is less than $N_{max}$.

The most significant bit of H(q) does not depend on $R_i$, but toggles for every i. Since the maximum length sequence contains an odd number of states of the LFSR ($2^{N_r-1}-1$), the PN-sequence is run twice before the interleaver pattern repeats itself.

In the above-mentioned version of the DVB standard, two major modes are defined, the 8 k mode ($N_r=13$) and the 2 k mode ($N_r=11$). Also, a 4 k mode ($N_r=12$) is envisaged. The different modes may be summarized as:

| mode | $N_r$ | $M_{max}$ | $N_{max}$ |
|------|-------|-----------|-----------|
| 2k   | 11    | 2048      | 1512      |
| 4k   | 12    | 4096      | 3024      |
| 8k   | 13    | 8192      | 6048      |

In approximately 35% (($M_{max}-N_{max}$) /$N_{max}$) of the loop iterations H(q) has to be recomputed, since the calculated value is out of range (H(q)≧$N_{max}$). This leads to a corresponding increase in execution time. However, as H(q) is compared in all generated loop iterations in the prior art, many unnecessary comparisons are made, resulting in non-optimal execution time and energy consumption.

The same problem occurs also in the deinterleaving process, wherein the mapping of the memory is the inverse of H(q).

What has been described above in relation to the DVB standard is also applicable to other interleaving schemes wherein appending one or several MSB to a generated address fragment will generate address values, which potentially are not within range, wherein a generated address value has to be checked to not exceed a maximum allowable value.

U.S. Pat. No. 6,314,534 B1 discloses a method and apparatus for address generation in an interleaver. An address is generated using a random address fragment and a bit reversed address fragment. It is a problem with this address generator in that the comparison to make sure that the address is within range is made every clock cycle. Thus, the execution time will be unnecessary long as addresses that are within range are compared.

U.S. Pat. No. 6,549,998 B1 discloses an interleaver for generating a valid interleaved address for each iteration. An address generator comprises two counters for addressing parallel lookup tables. A magnitude comparison is made to select the proper output. It is a problem with this address generator in that it comprises two counters, which makes it complicated. Furthermore, a comparison to make sure that the generated address is within range is made in each clock cycle. Also, as the address generator comprises two registers for storing tentative address values, an unnecessary amount of memory capacity is required.

SUMMARY OF THE INVENTION

It is an object of the invention to provide a method and a device for decreasing the processing capacity needed for generating address values based on address fragments to which at least one most significant bit (MSB) is appended.

The object of the invention is achieved by a method for generating an address value for addressing a memory. According to the method, consecutive address fragments, to which at least one most significant bit is to be appended, are generated. Only a fraction of the address fragments, which potentially will generate an address value out of range, is compared to a maximum allowable value. If the compared address fragment exceeds the maximum allowable value, the compared address fragment is discarded. However, if the compared address fragment does not exceed the maximum allowable value the compared address fragment is accepted.

The fraction of address values compared given a predetermined number of address values of an interleaving sequence is dependent on the number of MSBs. The fraction may e.g. be ½ if only one MSB is appended.

If necessary, the address fragments are permuted before or after being compared.

The address fragment following the compared address fragment is either generated in the same clock cycle as the compared address fragment, or in response to discarding or accepting the compared address fragment.

The next and second next address fragments following the compared address fragment may be generated by means of a feedback function.

The object of the invention is also achieved by a device for generating address values for addressing a memory. The device comprises a shift register having a predetermined number of registers for generating a maximum length pseudo noise (PN) sequence, i.e. consecutive address fragments. Comparator means is adapted to compare a fraction of the address fragments generated with a maximum allowable value. The compared address fragments will possibly generate address values out of range. A selector means is adapted to discard the compared address fragment if it exceeds the maximum allowable value, and to accept the compared address fragment otherwise.

A toggle means may be provided to append at least one bit being the most significant bit to any address fragment, or permuted address fragment, to generate the address value.

The device may be implemented by software comprising readable program means to be run by a processor. Alternatively, the device may be implemented as an application specific integrated circuit (ASIC) or a field programmable gate array (FPGA).

An interleaver for interleaving a block of data, comprising an interleaver memory and a device for generating address values according to the invention for addressing the memory also achieves the object of the invention.

A deinterleaver for interleaving a block of data, comprising a deinterleaver memory and a device for generating address values according to the invention for addressing the memory also achieves the object of the invention.

A communication apparatus for communicating data, comprising a memory and a device for generating address values according to the invention for addressing the memory also achieves the object of the invention.

Also, a software program product embodied on a computer readable medium comprising instructions for carrying out the method according to the invention when said product is run by a processor achieves the object of the invention.

Further embodiments of the invention are defined in the dependent claims.

It is an advantage of the invention that the processing capacity needed compared to address generation schemes known in the art is decreased. More specifically, the algorithm for generating address values presented in the ETSI standard mentioned above performs substantially more comparisons than according to the invention, resulting in non-optimal processing time and energy consumption. Thus, the present invention results in faster execution time, and since unnecessary operations are removed, decreased energy consumption.

It should be emphasized that the term "comprises/comprising" when used in this specification is taken to specify the presence of stated features, integers, steps or components but does not preclude the presence or addition of one or more other features, integers, steps, components or groups thereof.

BRIEF DESCRIPTION OF THE DRAWINGS

Further objects, features and advantages of the invention will appear from the following detailed description of the invention, reference being made to the accompanying drawings, in which.

DETAILED DESCRIPTION OF EMBODIMENTS

Figure 1:
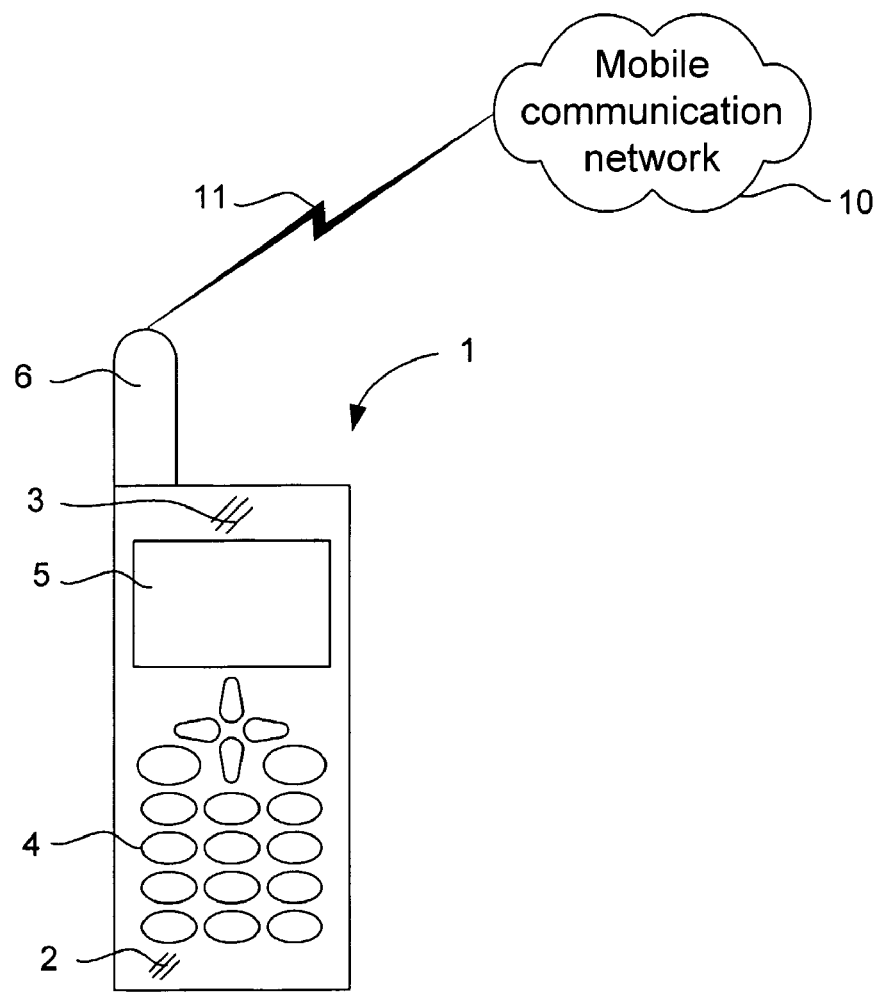
FIG. 1 is a schematic view of a mobile terminal connected to a mobile communication network.

FIG. 1 illustrates a mobile terminal 1 embodied as a mobile telephone, as one example of a communication apparatus comprising an interleaver according to the invention. The invention is not only applicable to a mobile terminal, but can be incorporated into any electronic communication apparatus, such as a portable communication apparatus, a mobile radio terminal, a pager, a communicator, an electronic organizer, a smartphone, a set-top-box, a TV-set, or a mobile television receiver, which has a need for sending and/or receiving interleaved data. The present invention may also be implemented in electronic devices which communicates over a cable or fiber connection, and is not limited to wireless communication.

The mobile terminal 1 comprises a user interface for user interaction, which e.g. may comprise a microphone 2, a loudspeaker 3, a keypad 4 and a display 5. The mobile terminal 1 also comprises a communication interface including an antenna 6 for communicating with a mobile communication network 10, or other electronic equipment, over a wireless communication link 11. The communication interface may also be adapted to communicate with other networks, such as a network for digital video broadcasting DVB), wherein the mobile terminal 1 is adapted to communicate directly with the DVB network. The communication interface for communicating with a mobile communication network or a DVB network could also be adopted to only receive DVB transmissions. That is, the mobile terminal 1 is not necessarily connected to a network (such that the network is aware of the presence of the mobile terminal) since the DVB transmissions are broadcast and hence the communication is one-way only.

Figure 2:
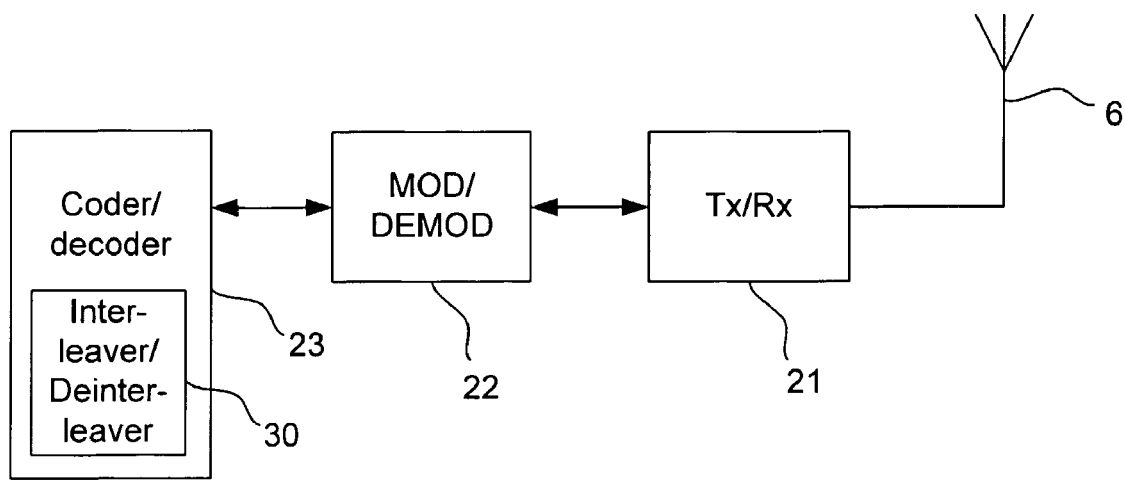
FIG. 2 is a block diagram of communication components of the mobile terminal of FIG. 1.

FIG. 2 illustrates the communication interface of the terminal 1 in more detail. The communication interface comprises a communication unit including e.g. a receiver/transmitter (Tx/Rx) unit 21, a modulator/demodulator unit 22, and a coder/decoder unit 23 connected to other units of the mobile terminal 1. The coder/decoder unit 23 comprises an interleaver/deinterleaver 30 according to the invention. The interleaver/deinterleaver 30 may alternatively be provided as a stand-alone unit. Furthermore, the communication interface may also be adapted to communicate over a cable or fiber connection.

Figure 3:
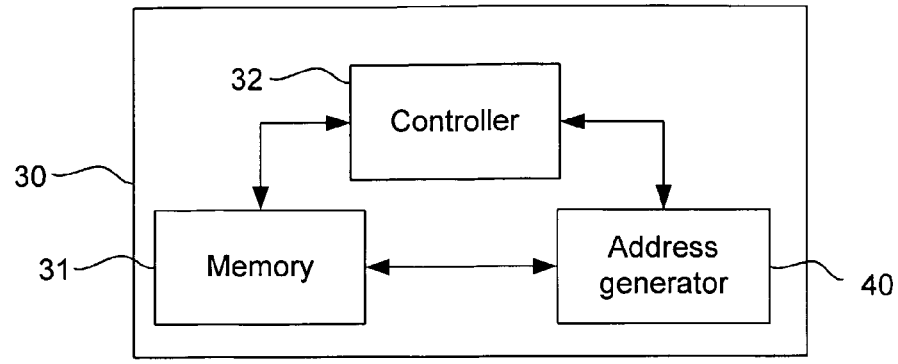
FIG. 3 is block diagram of an interleaver according to the invention.

FIG. 3 illustrates the interleaver/deinterleaver 30 in more detail. The interleaver/deinterleaver 30 comprises an interleaver/deinterleaver memory 31 adapted to store a predetermined number of data blocks, each having a certain number of bits. The memory 31 forms an array having a predetermined number of rows and columns. Blocks of data are read into the interleaver/interleaver memory 31 in a first order, and read out from the memory in a second order being different from the first order. Address values are generated for addressing each memory position of the array. To form blocks of data to be transmitted, the memory positions are addressed according to the interleaving pattern, which is often constructed to have random-like properties. The formed blocks thus comprise seemingly independent interleaved bits. After transmission, the transmitted blocks are deinterleaved, i.e. read into a deinterleaving memory, wherein the original blocks of data are restored. Thus, bit errors due to a bursty channel during transmission will be spread out. The errors may be restored by utilizing an error correction scheme. In the following, we will make reference to an interleaver and an interleaver memory, or simply memory, and its functionality for simplicity of notation. However, the present invention is equally relevant for a deinterleaver.

An interleaver address generator 40 is connected to the memory 31, and ensures that a proper address value is generated. The generated address value may be supplied to a controller 32, such as a central processing unit, which will address the memory and retrieve bits to be forwarded for transmission or use by other units of the terminal 1. Alternatively, the output of the address generator 40 is directly forwarded to the memory 31, which will output the data stored at the memory position corresponding to the specific address value.

Figure 4:
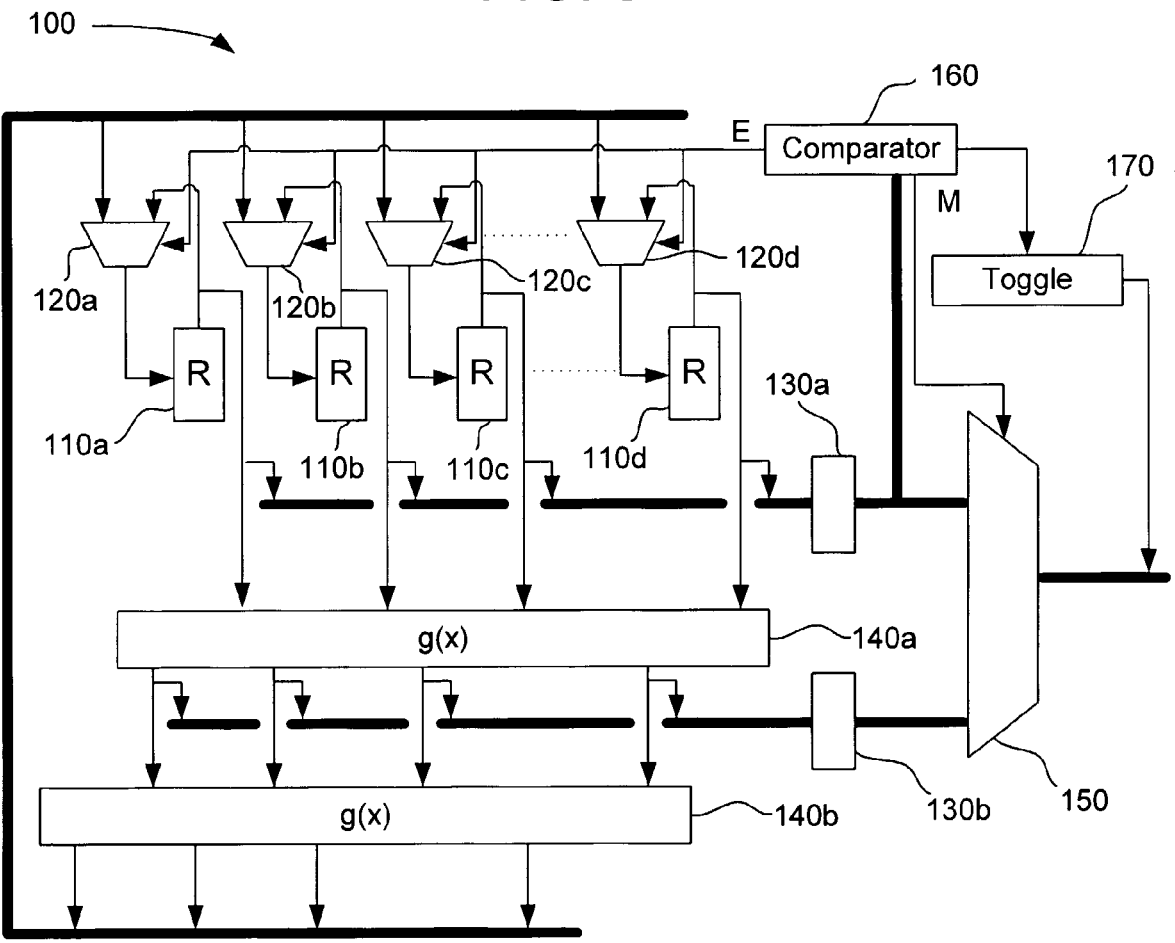
FIG. 4 is block diagram a first embodiment of an address generator according to the invention.

FIG. 4 illustrates in more detail an embodiment of a device for generating address values, or an address generator 100, according to the invention. The address generator 100 may e.g. be implemented as an application specific integrated circuit (ASIC), a field programmable gate array, hard-wired logic, or by software instructions to be executed by a processor of the terminal 1. The address generator 100 comprises a predetermined number ($N_r-1$) of registers 110a-110d required for generating an address fragment comprising a predetermined number of bits. Each input terminal of the registers 110a-110d is connected to an output terminal of a multiplexor 120a-120d. An output terminal of each register 110a-110d is connected to a first input terminal of the multiplexors 120a-120d. Also, the output terminals of the registers 110a-110d are operatively connected, through a bus, to a first permutation unit 130a. The output of the registers 110a-110d together form a vector denoted address fragment $R'_i$ below. The first permutation unit 130a is adapted to permute the address fragment into a second vector $R_i$ denoted permuted address fragment in the following. The permutation may be carried out according to different schemes. One scheme for permuting the address fragment $R'_i$ to satisfy the DVB standard is disclosed in ETSI EN300744, v1.4.1, ETSI, January 2001, which is enclosed herein by reference.

The output terminals of the registers 110a-110d are also connected to a first address fragment calculation unit 140a, which is adapted to generate a consecutive next address fragment $R'_{i+1}$ based on the present address fragment $R'_i$ by means of an address calculation or feedback function g(x). One scheme for calculating the next address fragment $R'_{i+1}$ by means of g(x) is presented in the above-mentioned ETSI standard. However, other schemes are also possible as long as a next address fragment is generated. Output terminals of the first address fragment calculation unit 140a are operatively connected, by means of a bus, to a second permutation unit 130b. The second permutation unit 130b is adapted to permute the next address fragment $R'_{i+1}$ to a permuted next address fragment $R_{i+1}$ according to the same principles as discussed in relation to the first permutation unit 130a.

Output terminals of the first address fragment calculation unit are also connected to a second address fragment calculation unit 140b. The second address fragment calculation unit 140b is adapted to calculate the second next address fragment $R'_{i+2}$ based on the next address fragment $R'_{i+1}$ by means of the address calculation function g(x). Output terminals of the second address calculation unit 140b are operatively connected to second input terminals of each multiplexor 120a-120d, wherein the values of the binary word $R'_{i+2}$ may be fed back to the registers 110a-110d.

The present address fragment $R'_i$, the next address fragment $R'_{i+1}$ and the second next address fragment $R'_{i+2}$ are available during the same clock cycle. Thus, at the input terminals of each multiplexor 120a-120d are the present value of each register 110a-110d, and the second next value as determined by the second address calculation unit 140b, available. Either of the present value or the second next value will be input to the registers in the next clock cycle, as will be described below.

Output terminals of the first and second permutation units 130a, 130b are connected to a selector unit 150. The selector unit 150 is adapted to select either the present permuted address fragment $R_i$ or the next permuted address fragment $R_{i+1}$, which are both available at the same clock cycle, based on a control signal M received from a comparator 160.

A toggle unit 170 is adapted to concatenate or append one or several MSBs (Most Significant Bits) to the output from the selector 150. According to the above-mentioned standard, if the present address fragment $R_i$ is output from the selector, a 1 is appended. If the next address fragment $R_{i+1}$ is output from the selector 150, 0 is appended. Thus, the complete address value H(q) for addressing the memory 31 is generated.

The present invention is not limited to a single bit as the MSB. One or several bits may be appended to the permuted address fragment to generate the address value. Then the toggle unit is adapted to toggle the MSBs between several values, some of which will generate address values out of range. Depending on the number of MSBs appended, only a fraction of the generated address values have to be compared, as will be described below. If one MSB is appended, every second address value may be out of range. However, if e.g. two MSBs are appended, the fraction could be ¼, ½, or ¾, depending on $N_{max}$. In the case of more than one MSB, more than two address fragment calculation units 140a, 140b may also be needed. More specifically, up to $2^{(number\ of\ MSBs)}$ address fragment calculation units may be needed. Furthermore, the comparator could be connected to more than one of the address fragment calculation units. More specifically, the comparator could be coupled to the fraction of the address fragment calculation units.

The address fragment $R'_i$, may according to the above mentioned standard take the following values:

i=0, 1: $R'_i[N_r-2, N_r-3, \ldots, 1, 0]=0, 0, \ldots, 0, 0$ i=2: $R'_i[N_r-2, N_r 3, \ldots, 1, 0]=0, 0, \ldots, 0, 1$ 2<i<$M_{max}$ {$R'_i[N_r-3, N_r-4, \ldots, 1, 0]=R'_{i-1}[N_r-2, N_r-3, \ldots, 1]$; in the 2 k mode: $R'_i[9]=R'_{i-1}[0]\oplus R'_{i-1}[3]$ in the 8 k mode: $R'_i[11]=R'_{i-1}[0]\oplus R'_{i-1}[1]\oplus R'_{i-1}[4]\oplus R'_{i-1}[6]$}

According to the present invention it is noted that for the above-mentioned standard, the address value may only be out of range for odd (i.e. i odd) shift register values, i.e. when a 1 is appended as the MSB. According to the embodiment of FIG. 4, the output of the permutation units 130a, 130b $R_i$ and $R_{i+1}$, i.e. the present and next permuted address fragments, are always less than or equal to $N_{max}$. E.g. for the 8 k mode, the output of the permutation units 130a, 130b comprises 12 bits, i.e. the maximum allowable value of the permuted address fragment is 4095 regardless whether it is an odd or even permuted address value. Appending a 0 as the MSB will not change the value of the permuted address fragment and hence the resulting address will not be out of range. However, appending a one as the MSB will generate an address value between 4096 and 8191, of which 2144 address values (8191−6048+1) are outside the wanted range of zero to 6047. Thus, it is only necessary to determine whether permuted address fragments to which a 1 is to be appended as an MSB are within range, i.e. only every second address fragment is compared when only one bit is appended as the MSB. Therefore, the comparator 160 is adapted to determine whether the present permuted address fragment is out of range, i.e. whether $R_i$ is less than or equal to $N_{max}$ as adjusted for the MSB. To satisfy the DVB standard, the comparator 160 is adapted to determine whether $R_i$<488, 976, or 1952 (6048−4096=1952) depending on the used mode (2 k, 4 k, or 8 k mode). It should be noted that the same compare function may be used for all three modes, as 1952=2×976=2×2×488. In the above example, it is determined whether the value of the permuted address fragment is less than 1952. I.e. a permuted address fragment having the value 1951 is the largest address fragment that will generate an address value within range if a 1 is appended as the MSB.

If $R_i$ is within range, the comparator 160 outputs the control signal M with information to the selector 150 to output the compared permuted address fragment $R_i$. Also, the comparator 160 outputs a toggle control signal received by the toggle unit 170, which will append a 1 as the MSB of $R_i$. Furthermore, the comparator 160 outputs a shift register control signal E, which is received at a third input of the multiplexors 120a-120d. If the multiplexors 120a-120d receive the control signal E, the present values of the registers 110a-110d are maintained in the registers. During the next clock cycle, the comparator 160 instructs the selector 150 to output the next address fragment $R_{i+1}$ without making any comparison, and instructs the toggle unit to append a 0 as the MSB of $R_{i+1}$.

During the clock cycle following the outputting of the next address fragment $R_{i+1}$, the registers 110a-110d are updated with the second next address fragment $R'_{i+2}$, and i is incremented by 2.

If a compared permuted address fragment is out of range, the comparator 160 outputs the control signal M with information to the selector 150 to output the next permuted address fragment $R_{i+1}$. Also, the comparator 160 instructs the toggle unit 170 to append a 0 as the MSB to the next permuted address fragment $R_{i+1}$. Furthermore, when the address fragment is out of range, the values of the registers 110a-110d are not withheld but updated during the next clock cycle.

The procedure of comparing every second address fragment, outputting or discarding the compared address value, and outputting the next address value is repeated until all values of i are iterated.

Thus, according to the embodiment of FIG. 4, a correct address value is generated in every clock cycle. Furthermore, comparisons are only made where necessary and not for every data. Thus the processing time and processing requirements for generating valid address values are decreased, which saves power.

Figure 5:
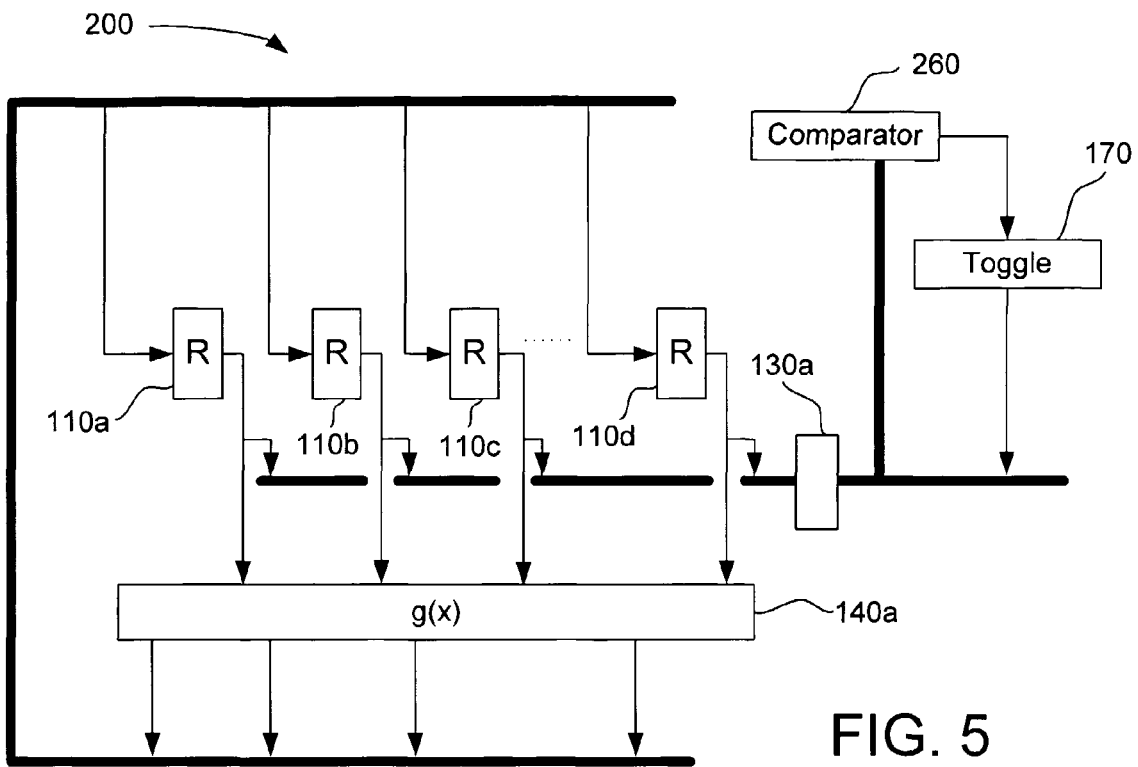
FIG. 5 is a second embodiment of an address generator according to the invention.

FIG. 5 illustrates a second embodiment of a device 200 for generating address values according to the invention. Components corresponding to components of the embodiment of FIG. 4 are denoted by the same reference numerals. In the embodiment of FIG. 5, the present address fragment $R'_i$ and the next address fragment $R'_{i+1}$ are generated during consecutive clock cycles. During a first clock cycle, the present address fragment is available from the registers 110a-110d, and permuted by the single permutation unit 130a. For every second, i.e. odd generated permuted address fragment, the comparator 260 is adapted to determine whether the permuted address fragment is within range, according to the same principles as described above. For every even permuted address fragment, the comparator 260 is adapted to acknowledge the output of the permutation unit 130a without any comparison.

If the present permuted address fragment $R_i$ is odd and is determined to be within range, the comparator 260 will instruct the toggle unit 170 to append a 1 as the MSB. Also, the comparator may issue a data available signal, e.g. to the controller 32, when the address value is available at the output of the address generator. Then, the comparator is adapted to update the registers 110a-110d with the output of the first address fragment calculation unit. Thus each register 110a-110d will comprise the value for the next address fragment. During the next clock cycle, the next, even, permuted address fragment will be generated and the next even address value (having a 0 as MSB) is generated without any comparison.

If the present permuted address fragment $R_i$ is odd and determined being out of range, the comparator 260 will not issue the data available signal until a new address value is generated. Thus no address value will be generated during the present clock cycle. In the following clock cycle, the next, even, permuted address fragment will be generated. The comparator 260 then directly without making any comparison instructs the toggle unit 170 to append a 0 as the MSB and issues the data available signal.

Figure 6:
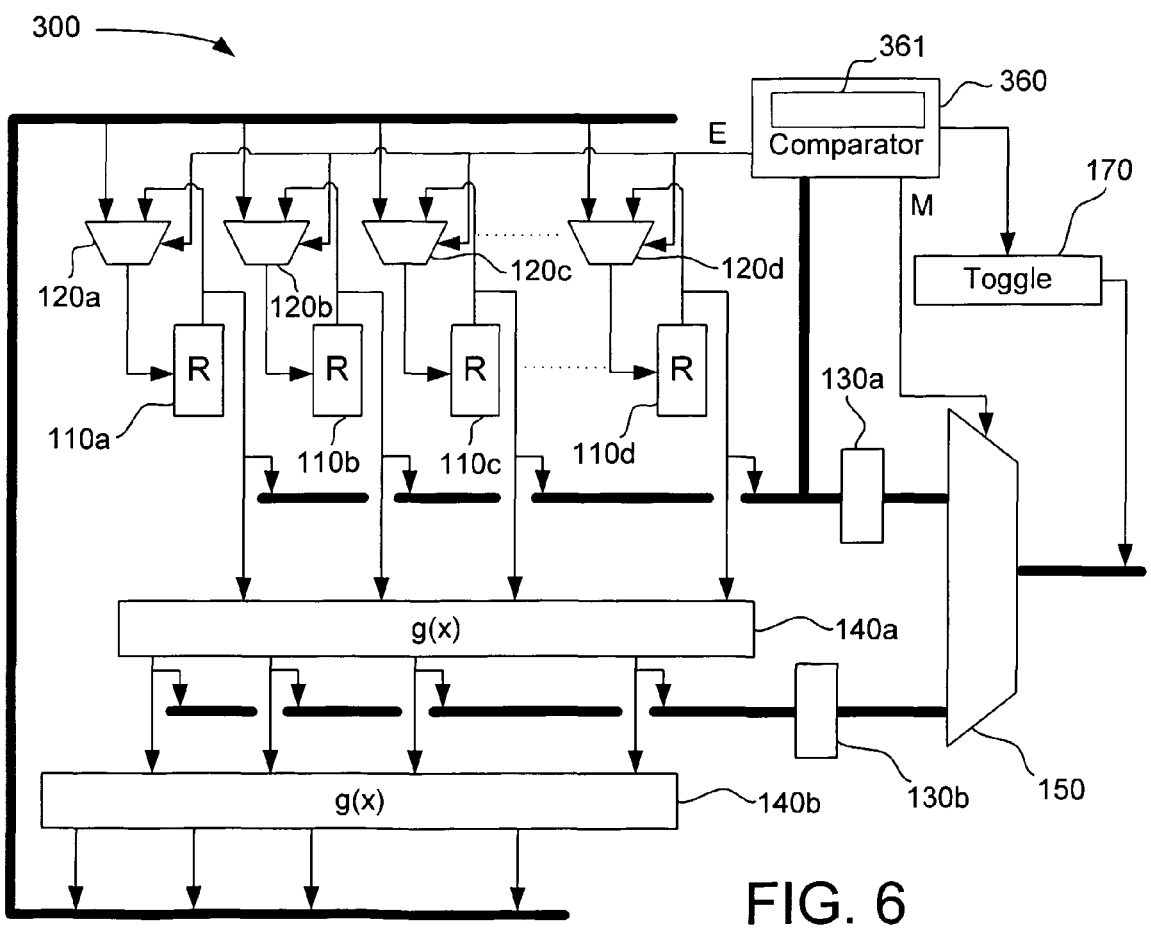
FIG. 6 is a third embodiment of an address generator according to the invention.

FIG. 6 illustrates a third embodiment of an address generator 300 according to the invention. Components corresponding to components of the embodiment of FIG. 4 are denoted by the same reference numerals. In the embodiment of FIG. 6, the present, the next and the second next address fragments are generated according to the same principles as described in relation to FIG. 4. The difference is that in the embodiment of FIG. 6 the comparator 360 is adapted to determine whether the present (odd) address fragment will generate a permuted address fragment, and consequently the address value, which may be out of range. Thus, the comparator 360 has knowledge of which address fragments that may generate permuted address fragments out of range. Such address fragments may be stored in an internal memory 361 or register of the comparator 360. The generated present address fragment is compared to address fragment values stored in the memory 361 to check whether the present permuted address fragment will be within range. If so, the comparator instructs the selector 150 to output the present permuted address fragment, and instructs the toggle unit 170 to append a 1 as the MSB. However, if the comparator 360 determines that the present address fragment is out of range, the present address fragment will be discarded. Then, the comparator will instruct the selector to output the next (even) permuted address fragment without any comparison, and instruct the toggle unit to append a 0 as the MSB.

In the above embodiments, the three first address values, $R'_0=0$, $R'_1=0$, $R'_2=1$, which gives $H(0)=0$, $H(1)=2^{Nr-1}$, and $H(2)<=2^{Nr-2}$, are taken care of separately, e.g. by the controller 32, since it is known beforehand that the resulting addresses are within range.

Furthermore, in the above embodiments the generated address fragments are permuted. However, permuting the address fragments may not be necessary if the registers are arranged to generate address fragments, to which an MSB directly may be appended to generate the address value. Also, appending the MSB may also not be necessary if the registers are arranged to generate the address values directly.

Figure 7:
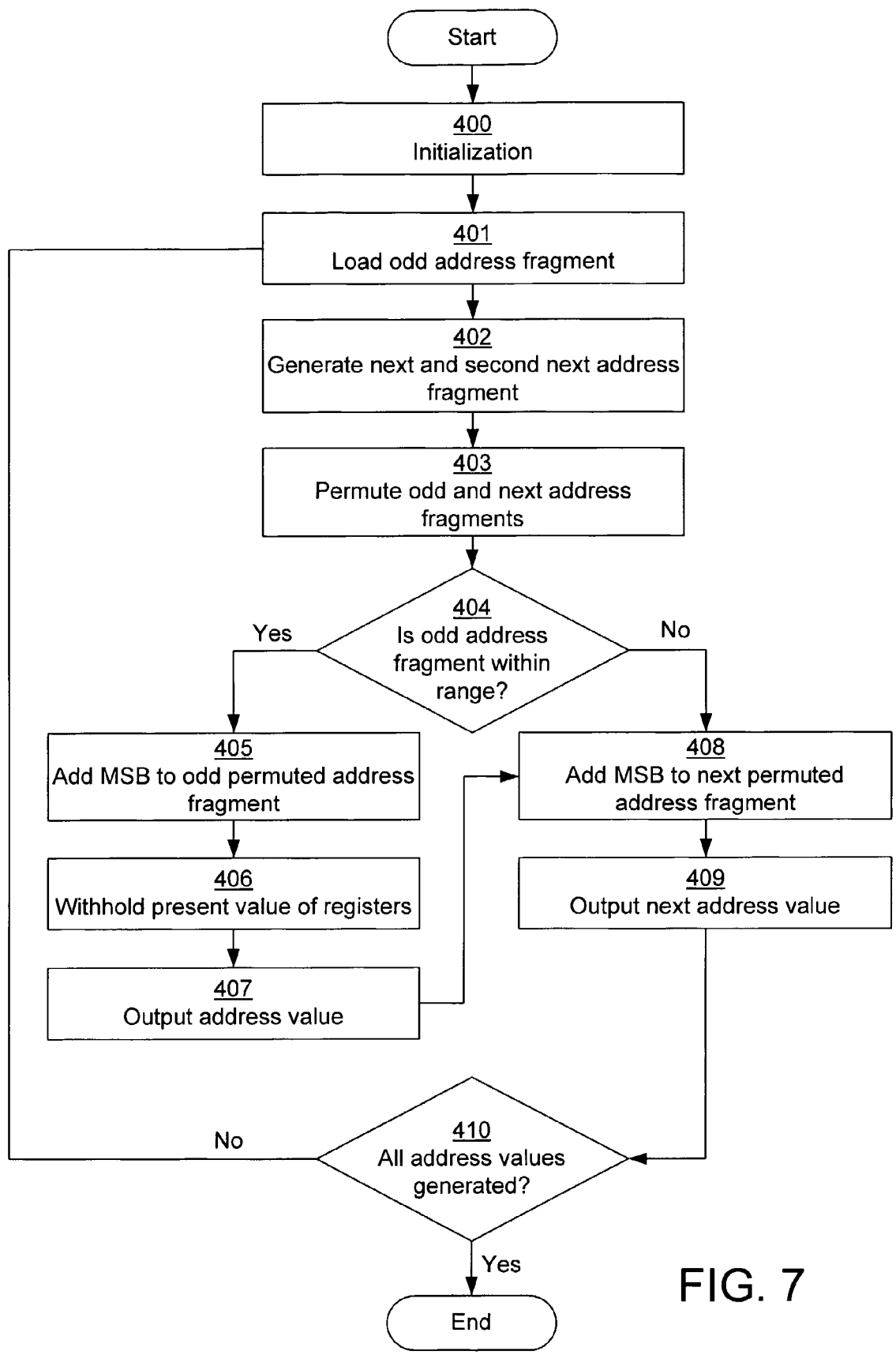
FIG. 7 is a flow chart of a method for generating address values according to the invention.

FIG. 7 illustrates one embodiment of the method according to the invention for generating address values for addressing the memory 31. In a first step 400, the procedure is initialized by taking care of the first three address fragments.

In step 401 the present (odd) address fragment (which is the second next address fragment from the previous cycle, except during the first cycle when the present odd address fragment is R'$_3$) is loaded into the registers, and in step 402 the next (even) and second next address fragments are generated. If required, the present and next address fragments are permuted in step 403. In step 404 it is determined whether the odd permuted address fragment is within range. If the answer in step 404 is yes, a 1 is in step 405 appended as an MSB to the address fragment permuted in step 403. In step 406, the present values of the registers are withheld. The generated present (odd) address value is then output in step 407.

If the answer in step 404 is no, the procedure proceeds to step 408, wherein a 0 is appended as an MSB to the next (even) permuted address fragment. Then, the next address value is output in step 409.

In step 410 it is determined whether all possible address values have been generated. If not, the procedure returns to step 401. Otherwise, the procedure is ended.

The method according to the invention has been described in relation to a number of steps. Some of the steps are not necessary to carry out the method according to the invention depending on the specific embodiment. The permutation may e.g. not be executed in all embodiments of the invention. Furthermore, some of the steps may also be executed in a different order. The second next address fragment may e.g. be generated in step 401 when it is needed.

The present invention has been described in the above as applicable to generate and address value for addressing an interleaver memory, such that data written into the memory in linear order is read from the memory in an interleaved order. However, the invention is also applicable to generate address values for addressing a deinterleaver memory, such that data written into the memory in an interleaved order is read from the memory in a linear order. In such a case, the mapping process for generating the address values is the inverse of H(q).

The present invention has been described above with reference to specific embodiments. However, other embodiments than the above described are equally possible within the scope of the invention. Different method steps than those described above, performing the method by hardware or software, may be provided within the scope of the invention. The different features and steps of the invention may be combined in other combinations than those described. The invention is only limited by the appended patent claims.

The invention claimed is:

1. A method for generating an address value for addressing a memory which is an interleaver or deinterleaver memory, comprising the steps of:
    generating a plurality of address fragments;
    comparing only a fraction of the generated address fragments with a maximum allowable value;
    wherein generating a plurality of address fragments further comprises the step of generating a first address fragment for a first address value, and a second address fragment, which is consecutive of the first address fragment, for a second address value; and
    wherein the step of comparing only a fraction of the generated address fragments with a maximum allowable value further comprises the step of comparing only every other address fragment of the plurality of address fragments with the maximum allowable value, whereby the step of comparing comprises comparing the first address fragment with the maximum allowable value.

2. The method according to claim 1, further comprising the steps of:
    discarding the compared address fragment if it exceeds the maximum allowable value; and
    accepting the compared address fragment otherwise.

3. The method according to claim 1, wherein the address fragments to be compared are permuted prior to the step of comparing.

4. The method according to claim 1, further comprising the step of appending at least one most significant bit(s) to any address fragment or a permuted address fragment.

5. The method according to claim 1, wherein the compared address fragment is an odd address fragment to which a 1 is to be appended as a most significant bit.

6. The method according to claim 1, wherein an even address fragment is generated in response to a step of discarding or accepting the compared address fragment.

7. The method according to claim 1, further comprising the steps of:
    generating at least the odd address fragment to be compared and a following even address fragment during a first clock cycle;
    if the compared odd address fragment is discarded, outputting the even address fragment during the first clock cycle;
    if the compared odd address fragment is accepted, outputting the odd compared address fragment and retaining values of registers of a shift register during the first clock cycle; and
    outputting the even address fragment during a second clock cycle following the first clock cycle.

8. The method according to claim 7, comprising the step of generating a next odd address fragment; and inputting the next odd address fragment into registers of a shift register.

9. The method according to claim 8, wherein the next even and next odd address fragments are generated by means of a feedback function (g(x)).

10. The method according to claim 7, wherein the next even and next odd address fragments are generated by means of a feedback function (g(x)).

11. The method according to claim 1, further comprising the steps of generating a next odd address fragment; and inputting the next odd address fragment into registers of a shift register.

12. The method according to claim 1, further comprising the steps of:
    discarding the compared address fragment if it exceeds the maximum allowable value;
    accepting the compared address fragment otherwise; and
    permuting the generated address fragments, wherein the address fragments to be compared are permuted prior to the step of comparing.

13. The method according to claim 12, further comprising the step of appending at least one most significant bit(s) to any address fragment or permuted address fragment.

14. The method according to claim 13, wherein the compared address fragment is an odd address fragment to which a 1 is to be appended as a most significant bit.

15. The method according to claim 14, wherein an even address fragment is generated in response to discarding or accepting the compared address fragment.

16. A method for generating an address value for addressing a memory which is an interleaver or deinterleaver memory comprising the steps of:

generating a plurality of address fragments by generating a first address fragment for a first address value and a second address fragment, which is consecutive of the first address fragment, for a second address value; and comparing only a fraction of the generated address fragments by comparing only every other address fragment of the plurality of address fragments with stored address fragments, which are known to be out of range when permuted and comparing the first address of fragment with the stored address fragments.

17. The method according to claim 16, further comprising the step of permuting the generated address fragments after the step of comparing.

18. A device for generating address values for addressing a memory, which is an interleaver or deinterleaver memory, comprising:

a means for generating a plurality of address fragments configured to generate a first address fragment for a first address value and a second address fragment, which is consecutive of the first address fragment, for a second address value; and a comparator means configured to compare only a fraction of the plurality of address fragments with a maximum allowable value and further configured to compare only every other address fragment of the plurality of address fragments with the maximum allowable value and thereby to compare the first address fragment with the maximum allowable value.

19. The device according to claim 18, further comprising a selector means configured to discard the compared address fragment if it exceeds the maximum allowable value, and to accept the compared address fragment otherwise.

20. The device according to claim 18, further comprising a permuting means configured to permute the address fragments, the permuting means being provided prior to the comparator means.

21. The device according to claim 18, further comprising a toggle means configured to append at least one most significant bit(s) to any address fragment, or to any permuted address fragment, in order to generate the address value.

22. The device according to claim 18, wherein the compared address fragments are address fragments to which a 1 is to be appended as a most significant bit.

23. The device according to claim 18, wherein the means for generating address fragments is configured to generate a next even address fragment in response to a discarding or acceptance of the compared address fragment.

24. The device according to claim 18, wherein the means for generating address fragments further comprises:

a shift-register comprising a predetermined number of registers configured to generate address fragments to be compared during a first clock cycle;

an address fragment calculation means configured to generate a next even address fragment during the first clock cycle, which is based on the address fragment to be compared;

a selector means is configured to, if the compared address fragment is discarded, output the even address fragment in response to a first control signal (M) during the first clock cycle, and to output the compared address fragment during the first clock cycle if the compared address fragment is accepted, and to output the even address fragment during a second clock cycle following the first clock cycle; and the shift register is configured to retain present values of the registers during the first clock cycle in response to a second control signal (E) if the compared address fragment is accepted.

25. The device according to claim 18, wherein the device is implemented by software comprising readable program means to be run by a processor.

26. The device according to claim 18, wherein the device is implemented as an application specific integrated circuit.

27. The device according to claim 18, wherein the device is implemented as a field programmable gate array.

28. The device according to claim 18, further comprising a shift register configured to generate a maximum length pseudo noise sequence.

29. The device according to claim 18, further comprising a selector means configured to discard the compared address fragment if it exceeds the maximum allowable value, and to accept the compared address fragment otherwise; and a permuting means configured to permute the address fragments, the permuting means being provided prior to the comparator means.

30. The device according to claim 29, further comprising toggle means configured to append at least one most significant bit(s) to any address fragment, or permuted address fragment, in order to generate the address value.

31. The device according to claim 30, wherein the compared address fragments are address fragments to which a 1 is to be appended as a most significant bit.

32. The device according to claim 31, wherein the means for generating address fragments is configured to generate a next even address fragment in response to discarding or accepting the compared address fragment.

33. The device according to claim 31, wherein the means for generating address fragments further comprises:

a shift-register comprising a predetermined number of registers configured to generate address fragments to be compared during a first clock cycle;

address fragment calculation means configured to generate a next even address fragment during the first clock cycle, which is based on the address fragment to be compared;

the selector means is configured to, if the compared address fragment is discarded, output the even address fragment in response to a first control signal (M) during the first clock cycle, and to output the compared address fragment during the first clock cycle if the compared address fragment is accepted, and to output the even address fragment during a second clock cycle following the first clock cycle; and the shift register is configured to retain present values of the registers during the first clock cycle in response to a second control signal (E) if the compared address fragment is accepted.

34. The device according to claim 33, wherein the address fragment calculation unit mean is configured to generate a next odd address fragment, based on the even address fragment, and feed back said next odd address fragment to the shift register.

35. The device according to claim 34, wherein the address fragment calculation means is configured to generate the next even and next odd address fragments by means of a feedback function.

36. The device according to claim 35, wherein the device is implemented as an application specific integrated circuit.

37. The device according to claim 33, wherein the address fragment calculation means is configured to generate the next even and next odd address fragments by means of a feedback function.

38. The device according to claim 37, wherein the device is implemented by software comprising readable program loaded in a computer readable medium and executed by a processor.

39. The device according to claim 35, wherein the device is implemented as a field programmable gate array.

40. The device according to claim 39, further comprising a shift register configured to generate a maximum length pseudo noise sequence.

41. A device for generating address values for addressing a memory which is an interleaver or deinterleaver memory, comprising:
- a means for generating a plurality of address fragments configured to generate a first address fragment for a first address value and a second address fragment, which is consecutive of the first address fragment, for a second address value; and
- a comparator means configured to compare only a fraction of the plurality of address fragments with a maximum allowable value, further being configured to compare only every other address fragment of the plurality of address fragments with stored address fragments, which are known to be out of range when permuted, and thereby to compare the first address fragment with stored address fragments.

42. The device according to claim 41, further comprising a permuting means configured to permute the address fragments, the permuting means being provided after the comparator means.

43. An interleaver for interleaving a block of data, having a memory which is an interleaver memory in combination and a device for generating address values, comprising:
- a means for generating a plurality of address fragments, and comparator means configured to compare only a fraction of the plurality of address fragments with a maximum allowable value, the means for generating a plurality of address fragments being configured to generate a first address fragment for a first address value and a second address fragment, which is consecutive of the first address fragment, for a second address value, and the comparator means being configured to compare only every other address fragment of the plurality of address fragments with the maximum allowable value and thereby compare the first address fragment with the maximum allowable value.

44. A deinterleaver for interleaving a block of data, having a memory, which is a deinterleaver memory, and a device for generating address values for addressing the memory, comprising:
- a means for generating a plurality of address fragments, and comparator means configured to compare only a fraction of the plurality of address fragments with a maximum allowable value, the means for generating a plurality of address fragments being configured to generate a first address fragment for a first address value and a second address fragment, which is consecutive of the first address fragment, for a second address value, and the comparator means being configured to compare only every other address fragment of the plurality of address fragments with the maximum allowable value and thereby compare the first address fragment with the maximum allowable value.

45. A communication apparatus for communicating data, comprising a memory which is an interleaver memory or a deinterleaver memory, and a device for generating address values for addressing the memory, comprising:
- a means for generating a plurality of address fragments configured to generate a first address fragment for a first address value and a second address fragment, which is consecutive of the first address fragment, for a second address value; and
- a comparator means configured to compare only a fraction of the plurality of address fragments with a maximum allowable value configured to compare only every other address fragment of the plurality of address fragments with the maximum allowable value and thereby compare the first address fragment with the maximum allowable value.

46. The communication apparatus according to claim 45, wherein the communication apparatus is one selected from the group consisting of a mobile radio terminal, a pager, a communicator, an electronic organizer, and a smartphone.

47. The communication apparatus according to claim 45, wherein the communication apparatus comprises a mobile telephone.

48. A communication apparatus for receiving data, comprising:
- a deinterleaver with a memory;
- a device for generating address values for addressing the memory;
- a means for generating a plurality of address fragments being configured to generate a first address fragment for a first address value and a second address fragment, which is consecutive of the first address fragment, for a second address value; and
- a comparator means configured to compare only a fraction of the plurality of address fragments with a maximum allowable value, the comparator means further being configured to compare only every other address fragment of the plurality of address fragments with the maximum allowable value and thereby to compare the first address fragment with the maximum allowable value.

49. The communication apparatus according to claim 48, wherein the communication apparatus is one selected from the group consisting of a set-top-box, a television set, and a mobile television receiver.

50. A software program product embodied on a non-transitory computer readable medium executable by computer hardware when the product is executed by a processor contained in said computer hardware, the product having instructions comprising:
- generating an address value for addressing a memory which is an interleaver or deinterleaver memory;
- generating a plurality of address fragments, and comparing only a fraction of the generated address fragments with a maximum allowable value;
- when generating a plurality of address fragments, generating a first address fragment for a first address value, and a second address fragment, which is consecutive of the first address fragment, for a second address value; and
- when comparing only a fraction of the generated address fragments with a maximum allowable value, comparing only every other address fragment of the plurality of address fragments with the maximum allowable value, whereby the step of comparing comprises comparing the first address fragment with the maximum allowable value.

* * * * *

UNITED STATES PATENT AND TRADEMARK OFFICE
CERTIFICATE OF CORRECTION

| | |
|---|---|
| PATENT NO. | : 7,873,800 B2 |
| APPLICATION NO. | : 10/598714 |
| DATED | : January 18, 2011 |
| INVENTOR(S) | : Berkeman |

It is certified that error appears in the above-identified patent and that said Letters Patent is hereby corrected as shown below:

On the Face Page, in Field (58), under "Field of Classification Search", in Column 2, Line 1, delete "None" and insert -- 711/005 --, therefor.

On the Face Page, in Field (56), under "U.S. PATENT DOCUMENTS", in Column 2, Line 4, below "6,314,534  B1  11/2001  Agrawal et al.  714/702" insert the missing entry -- 6,549,998  4/2003  Pekarich et al. --.

In Column 1, Line 61, delete "$M_{max}>_{Nmax}$" and insert -- $M_{max}>N_{max}$ --, therefor.

In Column 6, Line 60, delete "$N_r3$," and insert -- $N_r-3$, --, therefor.

In Column 3, Line 16, delete "shift register" and insert -- shift-register --, therefor at each occurrence throughout the patent.

Signed and Sealed this
Eighth Day of November, 2011

David J. Kappos
*Director of the United States Patent and Trademark Office*